(12) United States Patent
Katsuta et al.

(10) Patent No.: US 12,720,882 B2
(45) Date of Patent: Aug. 25, 2026

(54) OPTICAL DETECTION DEVICE INCLUDING INITIALIZATION CIRCUIT CONFIGURED TO IMPROVE DETECTION ACCURACY

(71) Applicant: Magnolia White Corporation, Tokyo (JP)

(72) Inventors: Tadayoshi Katsuta, Tokyo (JP); Yoshitaka Ozeki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 716 days.

(21) Appl. No.: 17/886,903

(22) Filed: Aug. 12, 2022

(65) Prior Publication Data

US 2023/0053241 A1 Feb. 16, 2023

(30) Foreign Application Priority Data

Aug. 16, 2021 (JP) ................................ 2021-132375
Jun. 17, 2022 (JP) ................................ 2022-098416

(51) Int. Cl.
*H10F 39/18* (2025.01)
*H10F 39/00* (2025.01)
*H10F 39/12* (2025.01)

(52) U.S. Cl.
CPC ........... *H10F 39/18* (2025.01); *H10F 39/198* (2025.01); *H10F 39/8033* (2025.01); *H10F 39/80373* (2025.01)

(58) Field of Classification Search
CPC .... H10F 39/18; H10F 39/198; H10F 39/8033; H10F 39/8037; H10F 39/80373
USPC ........................................................ 257/431
See application file for complete search history.

(56) References Cited

U.S. PATENT DOCUMENTS

2013/0015326 A1* 1/2013 Tamura ............... H10F 39/8037 257/290
2013/0107088 A1 5/2013 Minami et al.
2018/0063459 A1* 3/2018 Stark ...................... H04N 25/78
2019/0189827 A1* 6/2019 Haraguchi ........... H04N 25/683

FOREIGN PATENT DOCUMENTS

JP H06-078219 A 3/1994
JP 2006-085559 A 3/2006
JP 2013-098825 A 5/2013

OTHER PUBLICATIONS

Office Action issued in corresponding Japanese Patent Application No. 2022-098416, mailed Oct. 28, 2025 and English translation of same. 5 pages.

* cited by examiner

*Primary Examiner* — Norman D Richards
(74) *Attorney, Agent, or Firm* — K&L Gates LLP

(57) ABSTRACT

A detection device includes a plurality of detection elements that are arranged in a matrix having a row-column configuration in a detection area, and each comprise a photoelectric conversion element to which a reverse bias voltage is configured to be applied when detection is performed, and an initialization circuit configured to apply an initialization voltage higher than the reverse bias voltage to the photoelectric conversion element before the reverse bias voltage is applied to the photoelectric conversion element.

5 Claims, 15 Drawing Sheets

Gate Driver (RST)
15A
Gate Driver (Read)
15B
GLrst
RST<n>
RST<n+1>
GLrd
RD<n>
RD<n+1>
SL
Vdet<M>
Vdet<1>
DETECTION CIRCUIT
48
Vsf
Msf
Mrd
N1
N2
30
Vcom
Mrst
Vrst
3
Dx
Dy
Dz PD<m, n> (Cathode) (N1)
RST<n>
Mrst<m, n>
17
Vrst
Tr1
VGH
Tr2
INV
INIT Gate Driver (Read)
15A
15B
17
Vcom
INIT
VGL
INV
Tr1<1>
Tr2<1>
Tr1<M>
Tr2<M>
GLrst
RST<n>
RST<n+1>
GLrd
RD<n>
RD<n+1>
Vrst
Mrst
N1
30
Vsf
Msf
N2
Mrd
3
SL
Vdet<1>
Vdet<M>
DETECTION CIRCUIT
48
Dx
Dy
Dz

OPTICAL DETECTION DEVICE INCLUDING INITIALIZATION CIRCUIT CONFIGURED TO IMPROVE DETECTION ACCURACY

CROSS-REFERENCE TO RELATED APPLICATION

This application claims the benefit of priority from Japanese Patent Application No. 2021-132375 filed on Aug. 16, 2021 and Japanese Patent Application No. 2022-098416 filed on Jun. 17, 2022, the entire contents of which are incorporated herein by reference.

BACKGROUND

1. Technical Field

The present disclosure relates to a detection device.

2. Description of the Related Art

Optical detection devices are known in which a plurality of photoelectric conversion elements such as positive-intrinsic-negative (PIN) photodiodes are arranged on a substrate. Such an optical detection device is used as, for example, a biometric sensor, such as a fingerprint sensor or a vein sensor, that detects biological information. The photoelectric conversion elements are separately arranged at an arrangement pitch corresponding to a resolution of detection (The related technologies are described, for example, in Japanese Patent Application Laid-open Publication No. 2006-85559).

In general, the reverse bias current of the PIN photodiodes constituting the photoelectric conversion elements varies between individual photodiodes by a larger amount as a reverse bias voltage increases, and takes a longer time to be stabilized as the reverse bias voltage decreases. For this reason, the detection accuracy may decrease depending on the setting of the reverse bias voltage.

It is an object of the present disclosure to provide a detection device capable of restraining the detection accuracy from decreasing.

SUMMARY

A detection device according to an embodiment of the present disclosure includes a plurality of detection elements that are arranged in a matrix having a row-column configuration in a detection area, and each comprise a photoelectric conversion element to which a reverse bias voltage is configured to be applied when detection is performed, and an initialization circuit configured to apply an initialization voltage higher than the reverse bias voltage to the photoelectric conversion element before the reverse bias voltage is applied to the photoelectric conversion element.

A detection device according to an embodiment of the present disclosure includes a plurality of detection elements that are arranged in a matrix having a row-column configuration in a detection area, and each comprise a photoelectric conversion element to which a reverse bias voltage is configured to be applied when detection is performed, and an initialization circuit configured to initialize the detection elements. The initialization circuit includes first wiring configured to supply the reverse bias voltage to the photoelectric conversion element, second wiring configured to supply an initialization voltage higher the reverse bias voltage to the photoelectric conversion element, and a switch circuit configured to couple one of the first wiring and the second wiring to the detection elements.

DETAILED DESCRIPTION

Figure 1:
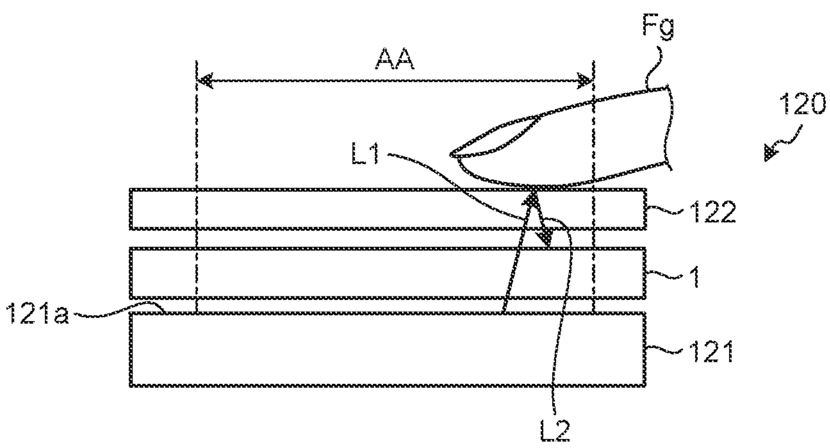
FIG. 1 is a sectional view illustrating a schematic sectional configuration of a detection apparatus having an illumination device, the detection apparatus including a detection device according to an embodiment of the present disclosure.

The following describes modes (embodiments) for carrying out the present disclosure in detail with reference to the drawings. The present disclosure is not limited to the description of the embodiments to be given below. Components to be described below include those easily conceivable by those skilled in the art or those substantially identical thereto. In addition, the components to be described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

FIG. 1 is a sectional view illustrating a schematic sectional configuration of a detection apparatus having an illumination device, the detection apparatus including a detection device according to an embodiment of the present disclosure. As illustrated in FIG. 1, a detection apparatus 120 having an illumination device includes a detection device 1, an illumination device 121, and a cover glass 122. The illumination device 121, the detection device 1, and the cover glass 122 are stacked in this order in a direction orthogonal to a surface of the detection device 1.

The illumination device 121 has a light-emitting surface 121*a* for emitting light, and emits light L1 from the light-emitting surface 121*a* toward the detection device 1. The illumination device 121 is a backlight. The illumination device 121 may be, for example, what is called a side light-type backlight that includes a light guide plate provided in a position corresponding to a detection area AA and a plurality of light sources arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly below the detection area AA. The illumination device 121 is not limited to the backlight, and may be provided on a lateral side or an upper side of the detection device 1, and may emit the light L1 from the lateral side or the upper side of a finger Fg.

The detection device 1 is provided so as to face the light-emitting surface 121*a* of the illumination device 121. The light L1 emitted from the illumination device 121 passes through the detection device 1 and the cover glass 122. The detection device 1 is, for example, a light-receptive biometric sensor, and can detect asperities (such as a fingerprint) on a surface of the finger Fg by detecting light L2 reflected on the surface the finger Fg. Alternatively, the detection device 1 may detect information on a living body by detecting the light L2 reflected inside the finger Fg in addition to detecting the fingerprint. Examples of the information on the living body include a blood vessel image, pulsation, and a pulse wave of, for example, a vein. The color of the light L1 from the illumination device 121 may be varied according to a detection target.

The cover glass 122 is a member for protecting the detection device 1 and the illumination device 121, and covers the detection device 1 and the illumination device 121. The cover glass 122 is, for example, a glass substrate. The cover glass 122 is not limited to a glass substrate, and may be, for example, a resin substrate. The cover glass 122 need not be provided. In this case, the surface of the detection device 1 is provided with a protective layer, and the finger Fg contacts the protective layer of the detection device 1.

The detection apparatus 120 having an illumination device may be provided with a display panel instead of the illumination device 121. The display panel may be, for example, an organic electroluminescent (EL) (organic light-emitting diode (OLED)) display panel or an inorganic EL (micro-LED or mini-LED) display. Alternatively, the display panel may be a liquid crystal display (LCD) panel using liquid crystal elements as display elements or an electrophoretic display (EPD) panel using electrophoretic elements as display elements. Also, in this case, display light emitted from the display panel passes through the detection device 1, and the fingerprint of the finger Fg and the information on the living body can be detected based on the light L2 reflected by the finger Fg.

Figure 2:
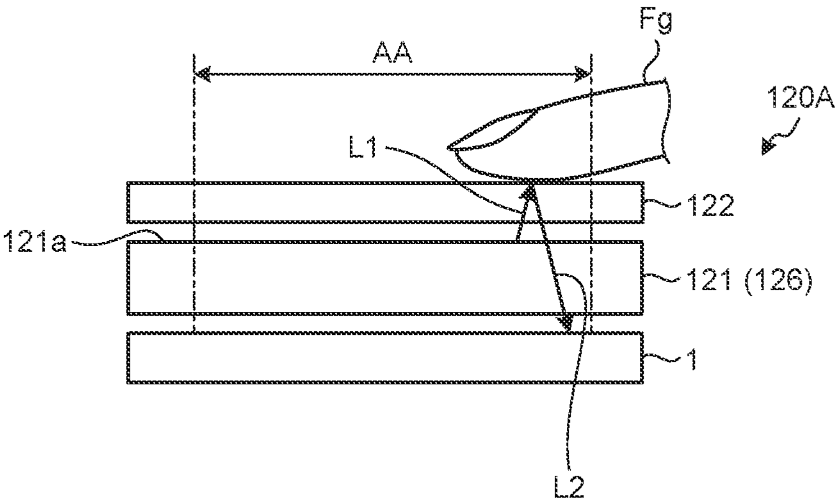
FIG. 2 is a sectional view illustrating a schematic sectional configuration of a detection apparatus having an illumination device according to a modification.

FIG. 2 is a sectional view illustrating a schematic sectional configuration of a detection apparatus having an illumination device according to a modification. As illustrated in FIG. 2, in the detection apparatus 120 having an illumination device, the detection device 1, the illumination device 121, the cover glass 122 are stacked in this order in the direction orthogonal to the surface of the detection device 1. Also, in the present modification, a display panel such as an organic EL display panel 126 can be employed instead of the illumination device 121.

The light L1 emitted from the illumination device 121 passes through the cover glass 122, and then, is reflected by the finger Fg. The light L2 reflected by the finger Fg passes through the cover glass 122, and further passes through the illumination device 121. The detection device 1 can perform the detection of the information on the living body such as the fingerprint detection by receiving the light L2 that has passed through the illumination device 121.

Figure 3:
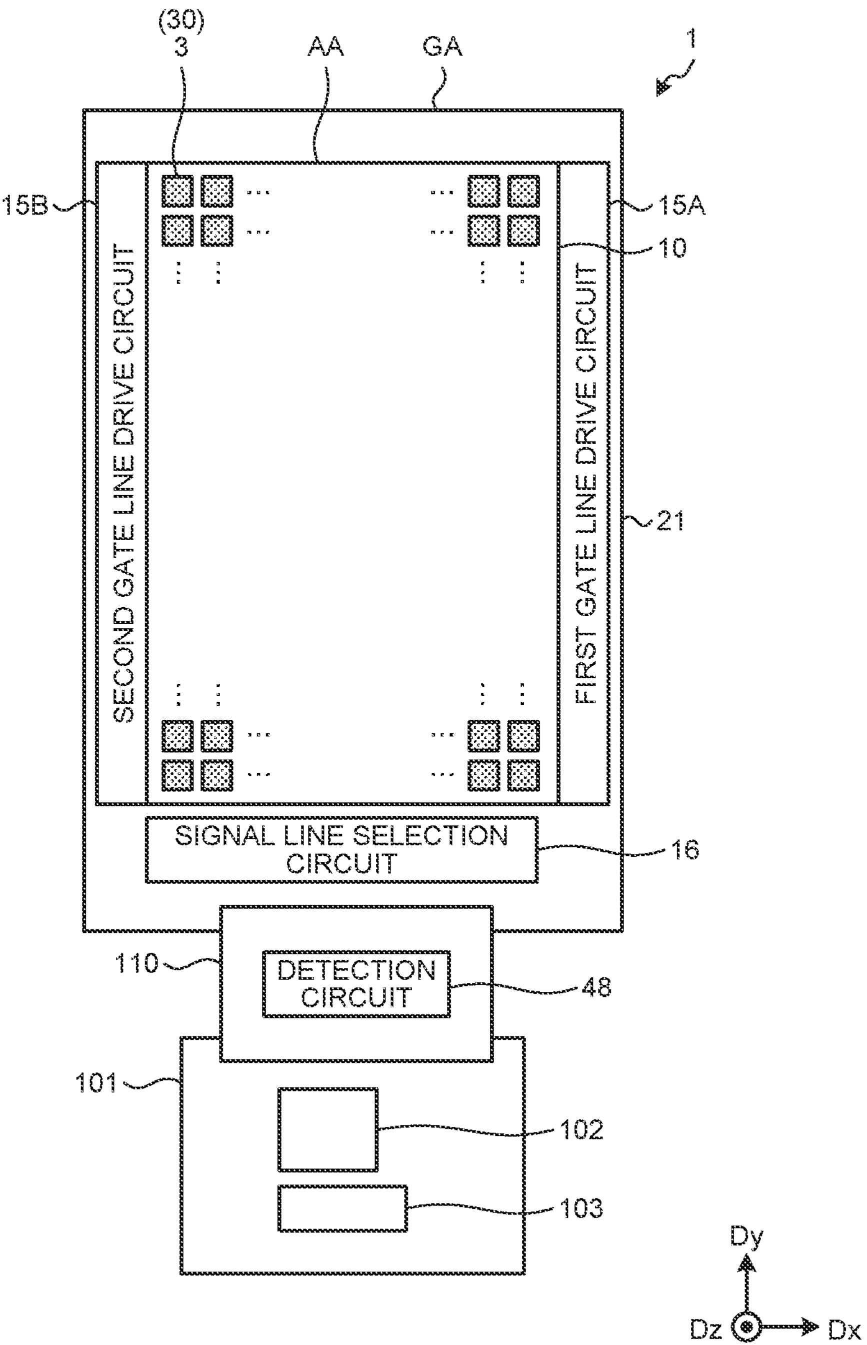
FIG. 3 is a plan view illustrating the detection device according to the embodiment.

FIG. 3 is a plan view illustrating the detection device according to the embodiment. As illustrated in FIG. 3, the detection device 1 includes a substrate 21, a sensor unit 10, a first gate line drive circuit 15A, a second gate line drive circuit 15B, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor unit 10, the first gate line drive circuit 15A, the second gate line drive circuit 15B, and the signal line selection circuit 16 to control a detection operation of the sensor unit 10. The power supply circuit 103 supplies voltage signals including, for example, a power supply potential Vsf and a reference potential Vcom (refer to FIG. 5) to the sensor unit 10, the first gate line drive circuit 15A, the second gate line drive circuit 15B, and the signal line selection circuit 16.

The substrate 21 has the detection area AA and a peripheral area GA. The detection area AA is an area overlapping a plurality of detection elements 3 included in the sensor unit 10. The peripheral area GA is an area outside the detection area AA, and is an area not overlapping the detection elements 3. That is, the peripheral area GA is an area between the outer perimeter of the detection area AA and the ends of the substrate 21. The first gate line drive circuit 15A, the second gate line drive circuit 15B, and the signal line selection circuit 16 are provided in the peripheral area GA.

Each of the detection elements 3 of the sensor unit 10 is a photosensor including a photoelectric conversion element 30. The photoelectric conversion element 30 is a photodiode, and outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection area AA. The photoelectric conversion element 30 included in each of the detection elements 3 performs the detection according to gate drive signals (for example, a reset control signal RST and a read control signal RD) supplied from the first gate line drive circuit 15A and the second gate line drive circuit 15B. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the detection elements 3.

The first gate line drive circuit 15A, the second gate line drive circuit 15B, and the signal line selection circuit 16 are provided in the peripheral area GA. Specifically, the first gate line drive circuit 15A and the second gate line drive circuit 15B are provided in areas extending along a second direction Dy in the peripheral area GA. The signal line selection circuit 16 is provided in an area extending along a first direction Dx in the peripheral area GA, and is provided between the sensor unit 10 and the detection circuit 48. The first gate line drive circuit 15A and the second gate line drive circuit 15B are arranged with the detection area AA interposed therebetween in the first direction Dx. The first gate line drive circuit 15A and the second gate line drive circuit 15B are not limited to this configuration, and may be formed as one circuit and arranged along one side of the detection area AA.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

Figure 4:
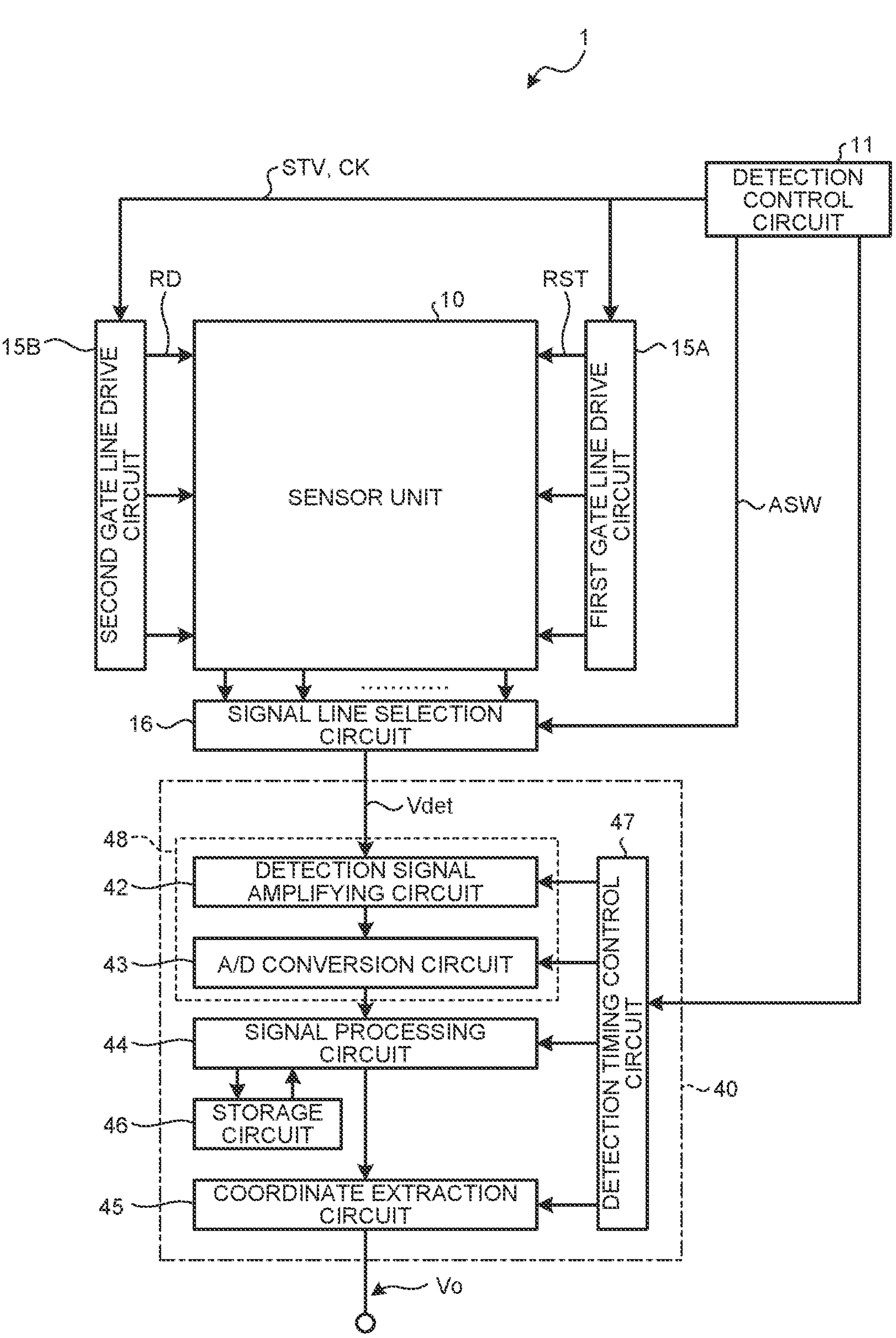
FIG. 4 is a block diagram illustrating a configuration example of the detection device according to the embodiment.

FIG. 4 is a block diagram illustrating a configuration example of the detection device according to the embodiment. As illustrated in FIG. 4, the detection device 1 further includes a detection control circuit 11 and a detector 40. One, some, or all of the functions of the detection control circuit 11 are included in the control circuit 102. One, some, or all of the functions of the detector 40 other than those of the detection circuit 48 are also included in the control circuit 102.

The detection control circuit 11 is a circuit that supplies respective control signals to the first gate line drive circuit 15A, the second gate line drive circuit 15B, the signal line selection circuit 16, and the detector 40 to control operations thereof. The detection control circuit 11 supplies various control signals including, for example, a start signal STV and a clock signal CK to the first gate line drive circuit 15A and the second gate line drive circuit 15B. The detection control circuit 11 also supplies various control signals including, for example, a selection signal ASW to the signal line selection circuit 16 during a detection period for performing detection processing.

The first gate line drive circuit 15A and the second gate line drive circuit 15B are circuits that drive a plurality of gate lines (read control scan lines GLrd and reset control scan lines GLrst (refer to FIG. 5)) based on the various control signals. The first gate line drive circuit 15A and the second gate line drive circuit 15B sequentially or simultaneously select the gate lines, and supply the gate drive signals (for example, the reset control signals RST and the read control signals RD) to the selected gate lines. Through this operation, the first gate line drive circuit 15A and the second gate line drive circuit 15B select the photoelectric conversion elements 30 coupled to the gate lines.

Figure 5:
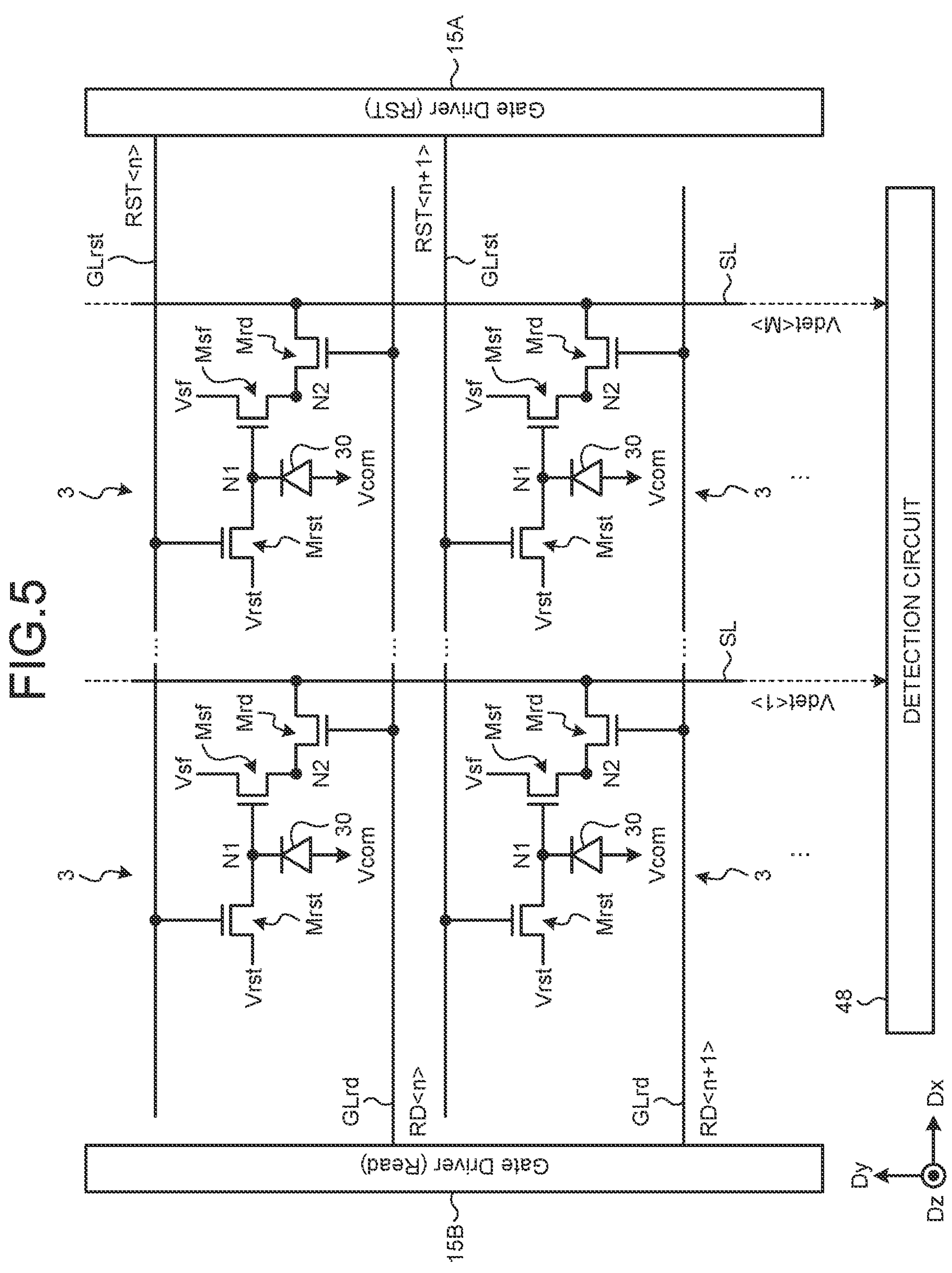
FIG. 5 is a circuit diagram illustrating a plurality of detection elements.

The signal line selection circuit 16 is a switching circuit that sequentially or simultaneously selects a plurality of output signal lines SL (refer to FIG. 5). The signal line selection circuit 16 is, for example, a multiplexer. The signal line selection circuit 16 couples the selected output signal lines SL to the detection circuit 48 based on the selection signals ASW supplied from the detection control circuit 11. Through this operation, the signal line selection circuit 16 outputs the detection signals Vdet from the detection elements 3 to the detector 40. The signal line selection circuit 16 may be omitted. In this case, the output signal lines SL may be directly coupled to the detection circuit 48.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity received by the sensor unit 10 based on output signals of the detection circuit 48. The signal processing circuit 44 can detect the fingerprint that is the asperities on the surface of the finger Fg based on the signals from the detection circuit 48 when the finger Fg is in contact with or in proximity to a detection surface. The signal processing circuit 44 may detect the information on the living body based on the signals from the detection circuit 48. Examples of the information on the living body include the blood vessel image, the pulse wave, the pulsation, and a blood oxygen saturation level of the finger Fg. In the present embodiment, the detection device treats the finger Fg (fingerprint) as an object to be detected (detection target). However, the object to be detected is not limited to the finger Fg, and may be any part as long as it is a part of the living body, such as a palm, a wrist, or a sole.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44.

The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example and an operation example of the detection device 1. FIG. 5 is a circuit diagram illustrating the detection elements. As illustrated in FIG. 5, each of the detection elements 3 includes the photoelectric conversion element 30, a reset transistor Mrst, a read transistor Mrd, and a source follower transistor Msf. The detection elements 3 are provided with the reset control scan lines GLrst and the read control scan lines GLrd as detection drive lines (gate lines), and provided with the output signal lines SL as wiring for reading signals.

The reset control scan lines GLrst, the read control scan lines GLrd, and the output signal lines SL are each coupled to the detection elements 3. Specifically, the reset control scan lines GLrst and the read control scan lines GLrd extend in the first direction Dx (refer to FIG. 3), and are each coupled to the detection elements 3 arranged in the first direction Dx. The output signal lines SL extend in the second direction Dy, and are coupled to the detection elements 3 arranged in the second direction Dy. The output signal lines SL are wiring from which signals from the transistors (read transistors Mrd and source follower transistors Msf) are output.

The reset transistor Mrst, the read transistor Mrd, and the source follower transistor Msf are provided correspondingly to each of the photoelectric conversion elements 30. Each of the transistors included in the detection element 3 is constituted by an n-type thin-film transistor (TFT). However, each of the transistors is not limited thereto, and may be constituted by a p-type TFT.

The reference potential Vcom is applied to the anode of the photoelectric conversion element 30. The cathode of the photoelectric conversion element 30 is coupled to a node N1. The node N1 is coupled to one of the source and the drain of the reset transistor Mrst, and to the gate of the source follower transistor Msf. When light irradiates the photoelectric conversion element 30, a signal (electric charge) output from the photoelectric conversion element 30 is stored in a capacitive element generated at the node N1.

The gate of the reset transistor Mrst is coupled to a corresponding one of the reset control scan lines GLrst. The other of the source and the drain of the reset transistor Mrst is supplied with a reset potential Vrst. When the reset transistor Mrst is turned on (into a conduction state) in response to the reset control signal RST supplied from the first gate line drive circuit 15A, the potential of the node N1 is reset to the reset potential Vrst. The reference potential Vcom has a potential lower than the reset potential Vrst, and the photoelectric conversion element 30 is driven in a reverse bias state.

The source follower transistor Msf is coupled between a terminal supplied with the power supply potential Vsf and the read transistor Mrd (node N2). The gate of the source follower transistor Msf is coupled to the node N1. The gate of the source follower transistor Msf is supplied with a signal (voltage) corresponding to the signal (electric charge) generated by the photoelectric conversion element 30. This operation causes the source follower transistor Msf to output a signal voltage corresponding to the signal (electric charge) generated by the photoelectric conversion element 30 to the read transistor Mrd.

The read transistor Mrd is coupled between the source of the source follower transistor Msf (node N2) and a corresponding one of the output signal lines SL. The gate of the read transistor Mrd is coupled to a corresponding one of the read control scan lines GLrd. When the read transistor Mrd is turned on in response to the read control signal RD supplied from the second gate line drive circuit 15B, the signal output from the source follower transistor Msf, that is, the signal (voltage) corresponding to the signal (electric charge) generated by the photoelectric conversion element 30 is output as the detection signal Vdet to the output signal line SL.

In FIG. 5, the reset transistor Mrst and the read transistor Mrd each have a single-gate structure. However, the reset transistor Mrst and the read transistor Mrd may each have what is called a double-gate structure constituted by two transistors coupled in series, or may be have a configuration constituted by three or more transistors coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 6:
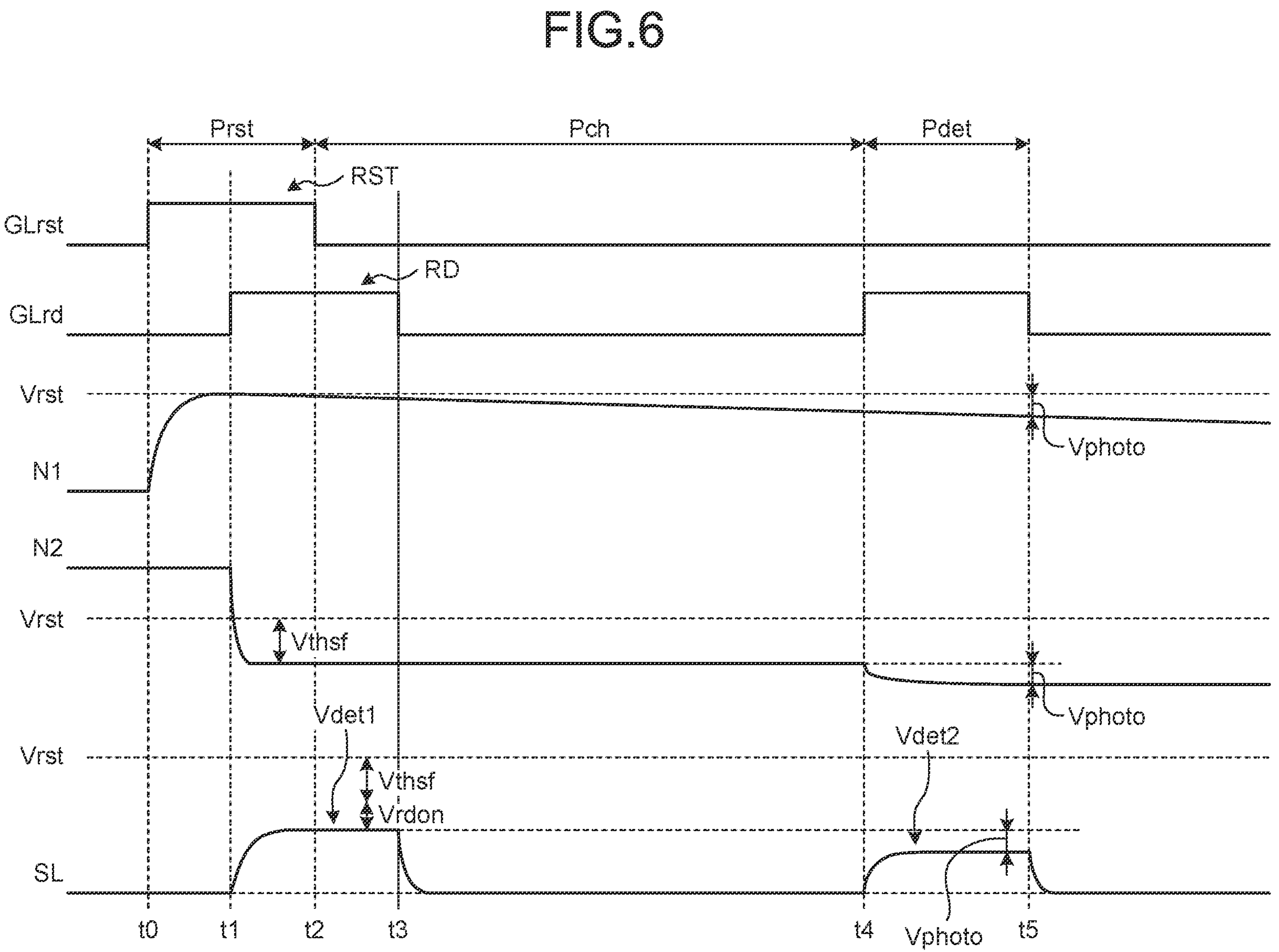
FIG. 6 is a timing waveform diagram illustrating an operation example of one of the detection elements in a detection period.

FIG. 6 is a timing waveform diagram illustrating an operation example of the detection element during the detection period. As illustrated in FIG. 6, the detection element 3 performs the detection in the order of a reset period Prst, a storage period Pch, and a read period Pdet during the detection period. The power supply circuit 103 supplies the reference potential Vcom to the anode of the photoelectric conversion element 30 over the reset period Prst, the storage period Pch, and the read period Pdet.

At time t0, the control circuit 102 sets the reset control signal RST supplied to the reset control scan line GLrst to HIGH (high-level voltage) to start the reset period Prst. In the reset period Prst, the reset transistor Mrst is turned on (into the conduction state) to increase the potential of the node N1 to the reset potential Vrst. As a result, the photoelectric conversion element 30 is reverse-biased by the potential difference between the reset potential Vrst and the reference potential Vcom. The read transistor Mrd is off (in a nonconduction state). Hence, the source of the source follower transistor Msf is charged by the power supply potential Vsf to increase the potential of the node N2.

At time t1, the control circuit 102 sets the read control signal RD supplied to the read control scan line GLrd to HIGH (high-level voltage). As a result, the read transistor Mrd is turned on (into the conduction state) to set the potential of the node N2 to (Vrst−Vthsf). Vthsf denotes a threshold voltage Vthsf of the source follower transistor Msf.

At time t2, the control circuit 102 sets the reset control signal RST to LOW (low-level voltage) to end the reset period Prst and start the storage period Pch. In the storage period Pch, the reset transistor Mrst is turned off (into the nonconduction state). The signal corresponding to the light irradiating the photoelectric conversion element 30 is stored to reduce the potential of the node N1 to (Vrst−Vphoto). Vphoto denotes a signal (voltage change amount) corresponding to the light irradiating the photoelectric conversion element 30.

At time t3, the potential of a detection signal Vdet1 output from the output signal line SL is set to (Vrst−Vthsf−Vrdon). Vrdon denotes a voltage drop caused by on-resistance of the read transistor Mrd.

At time t3, the control circuit 102 sets the read control signal RD to LOW (low-level voltage). As a result, the read transistor Mrd is turned off (into the nonconduction state) to set the potential of the node N2 to be constant at (Vrst−Vthsf). The output signal line SL is loaded so as to output the detection signal Vdet at LOW (low-level voltage).

At time t4, the control circuit 102 sets the read control signal RD(n) to HIGH (high-level voltage). As a result, the read transistor Mrd is turned on (into the conduction state) to end the storage period Pch and start the read period Pdet. The potential of the node N2 changes to (Vrst−Vthsf−Vphoto) in response to the signal Vphoto. The potential of a detection signal Vdet2 output in the read period Pdet decreases by an amount of the signal Vphoto from the potential of the detection signal Vdet1 obtained at time t3 and is set to (Vrst−Vthsf−Vrdon−Vphoto).

The detector 40 can detect the light irradiating the photoelectric conversion element 30 based on the signal (Vphoto) of the difference between the detection signal Vdet1 at time t3 and the detection signal Vdet2 at time t5. While FIG. 6 illustrates the operation example of one of the detection elements 3, the first gate line drive circuit 15A and the second gate line drive circuit 15B can cause the detection elements 3 in the entire detection area AA to perform the detection by sequentially scanning the reset control scan lines GLrst and the read control scan lines GLrd in a time-division manner.

Figure 7:
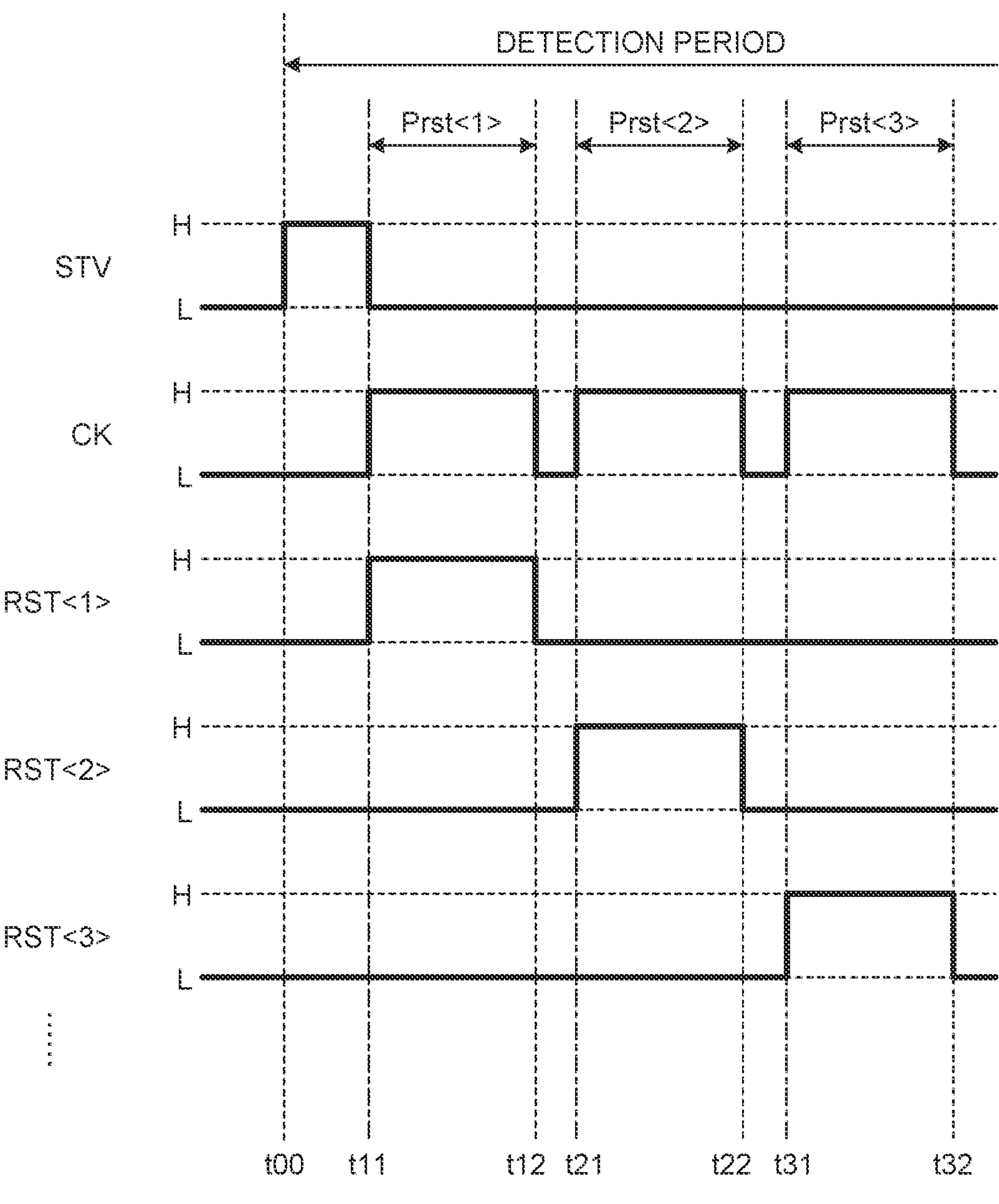
FIG. 7 is a timing diagram illustrating an example of output timing of reset control signals during the detection period.

FIG. 7 is a timing diagram illustrating an example of output timing of the reset control signals during the detection period.

As illustrated in FIG. 7, at time t10 when the detection period starts, the start signal STV is controlled to be "H" (high-level voltage), and the reset control signals RST<1>, RST<2>, RST<3>, . . . are sequentially controlled to be "H" (high-level voltage) at each rising edge of the clock signal CK. A period when the reset control signal RST<1> is "H" (high-level voltage) corresponds to a reset period Prst<1> in the first row of the detection elements 3 arranged in the first direction Dx of the detection area AA. A period when the reset control signal RST<2> is "H" (high-level voltage) corresponds to a reset period Prst<2> in the second row of the detection elements 3 arranged in the first direction Dx of the detection area AA. A period when the reset control signal RST<3> is "H" (high-level voltage) corresponds to a reset period Prst<3> in the third row of the detection elements 3 arranged in the first direction Dx of the detection area AA.

Figure 8:
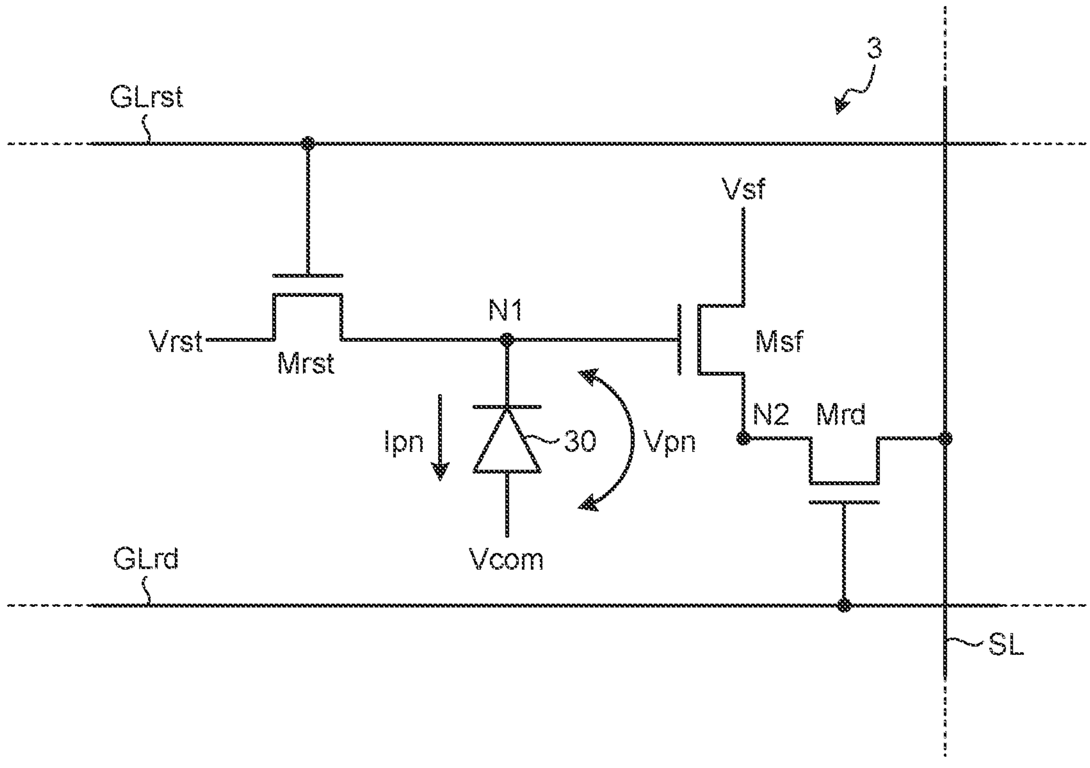
FIG. 8 is a diagram explaining an operation of the detection element during a reset period.

FIG. 8 is a diagram explaining an operation of the detection element during the reset period. As described above, the photoelectric conversion element 30 is reverse-biased during the reset period Prst. At this time, a reverse bias voltage Vpn serving as a potential difference between the reset potential Vrst and the reference potential Vcom is applied to the photoelectric conversion element 30. As a result, a reverse bias current Ipn flows through the photoelectric conversion element 30.

Figure 9A:
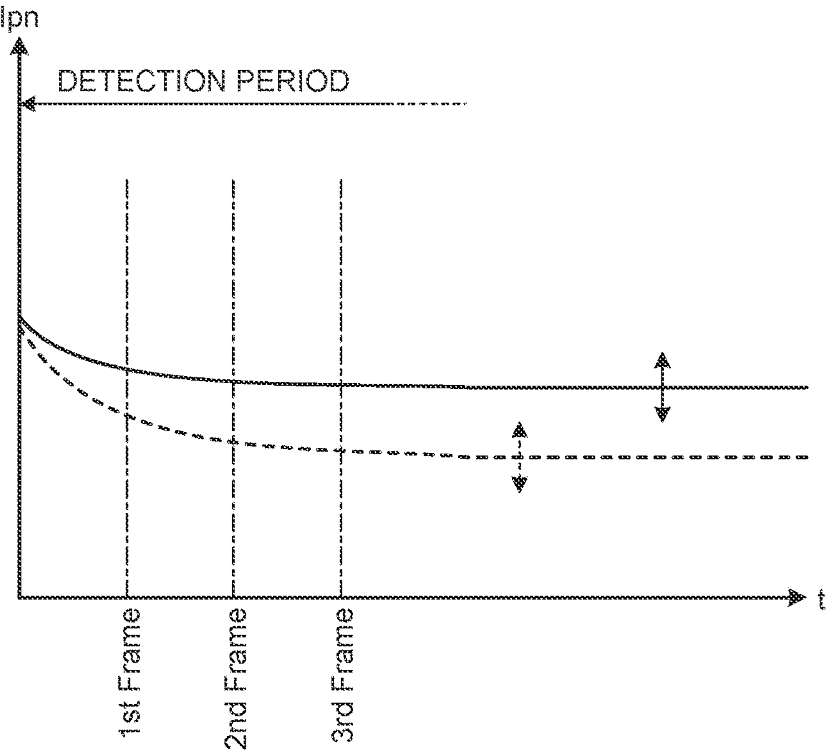
FIG. 9A is a diagram illustrating a relation between a reverse bias voltage and a reverse bias current of a positive-intrinsic-negative (PIN) photodiode.
Figure 9B:
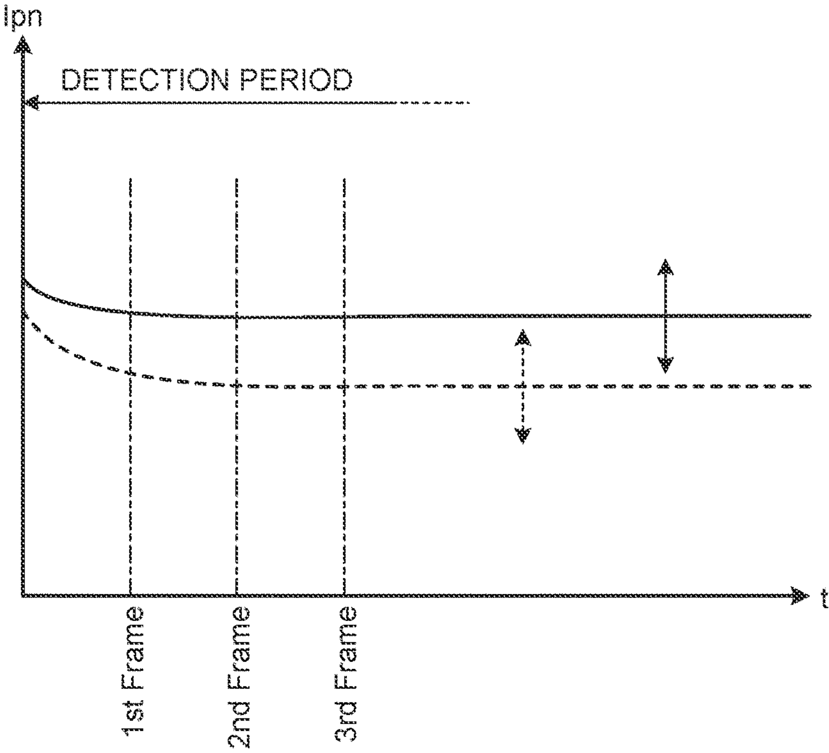
FIG. 9B is a diagram illustrating the relation between the reverse bias voltage and the reverse bias current of the PIN photodiode.
Figure 9C:
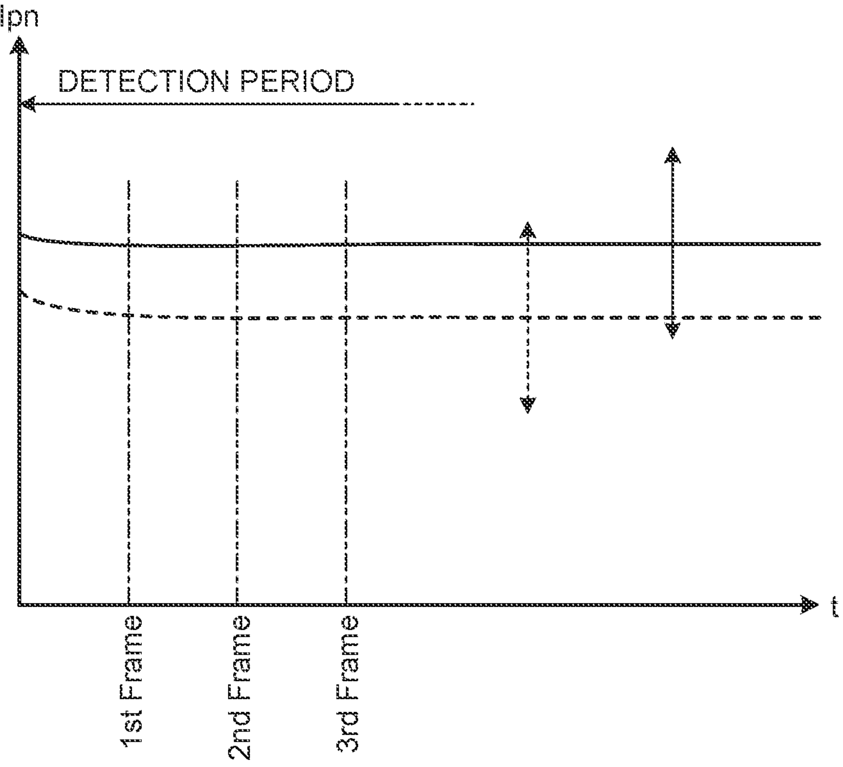
FIG. 9C is a diagram illustrating the relation between the reverse bias voltage and the reverse bias current of the PIN photodiode.

FIGS. 9A, 9B, and 9C are diagrams illustrating a relation between the reverse bias voltage and the reverse bias current of the PIN photodiode. FIG. 9A illustrates temporal changes of the reverse bias current when the reverse bias voltage Vpn is relatively lower. FIG. 9C illustrates the temporal changes of the reverse bias current when the reverse bias voltage Vpn is relatively higher. FIG. 9B illustrates the temporal changes of the reverse bias current when the reverse bias voltage Vpn is higher than that in the example illustrated in FIG. 9A, and lower than that in the example illustrated in FIG. 9C. In each of the examples illustrated in FIGS. 9A, 9B, and 9C, a solid line indicates a temporal change of the reverse bias current Ipn in the bright area, and a dashed line indicates the temporal change of the reverse bias current Ipn in the dark area. In each of FIGS. 9A, 9B, and 9C, a solid-line arrow and a dashed-line arrow conceptually represent relative amounts of variation of the reverse bias current Ipn.

In general, as illustrated in FIGS. 9A, 9B, and 9C, the variation of the reverse bias current Ipn of the PIN photodiode constituting the photoelectric conversion element 30 of the detection element 3 increases as the reverse bias voltage Vpn increases. Therefore, the reverse bias voltage Vpn applied to the photoelectric conversion element 30 is preferably lower.

However, as illustrated in FIGS. 9A, 9B, and 9C, reducing the reverse bias voltage Vpn of the PIN photodiode increases the time from when the reverse bias voltage Vpn is applied until the reverse bias current Ipn stabilizes. As a result, for example, when the detection signal Vdet is acquired over a plurality of frames (plurality of times) to improve detection accuracy, the value of the detection signal Vdet acquired in each of the frames may change, thus disabling accurate detection processing.

In the present disclosure, the detection period illustrated in FIG. 7 is preceded by an initialization period of applying an initialization voltage higher than the reverse bias voltage Vpn that is applied to the photoelectric conversion element 30 in the detection period. Thereby, the time for stabilizing the reverse bias current Ipn in the detection period is shortened, and the detection accuracy is restrained from decreasing. The following describes a configuration and an operation to apply, during the initialization period before the detection period, the initialization voltage higher than the reverse bias voltage Vpn that is applied to the photoelectric conversion element 30 in the detection period.

First Embodiment

Figure 10:
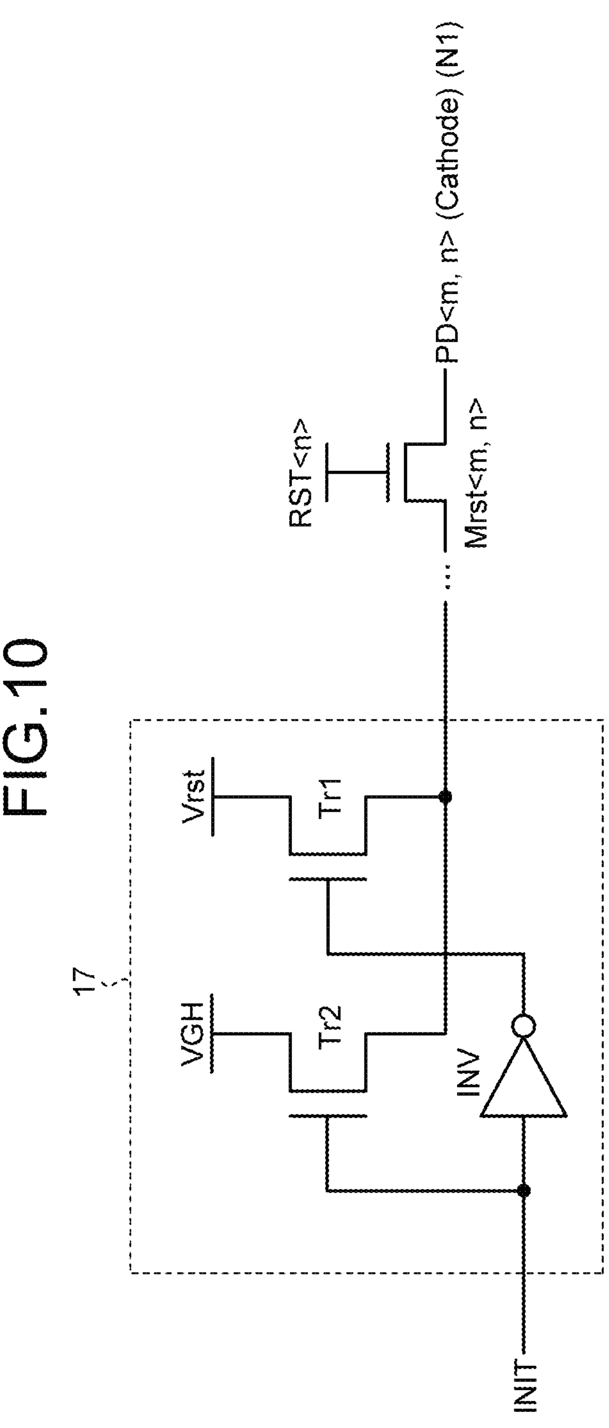
FIG. 10 is a diagram illustrating a configuration example of an initialization circuit of the detection device according to a first embodiment of the present disclosure.
Figure 11:
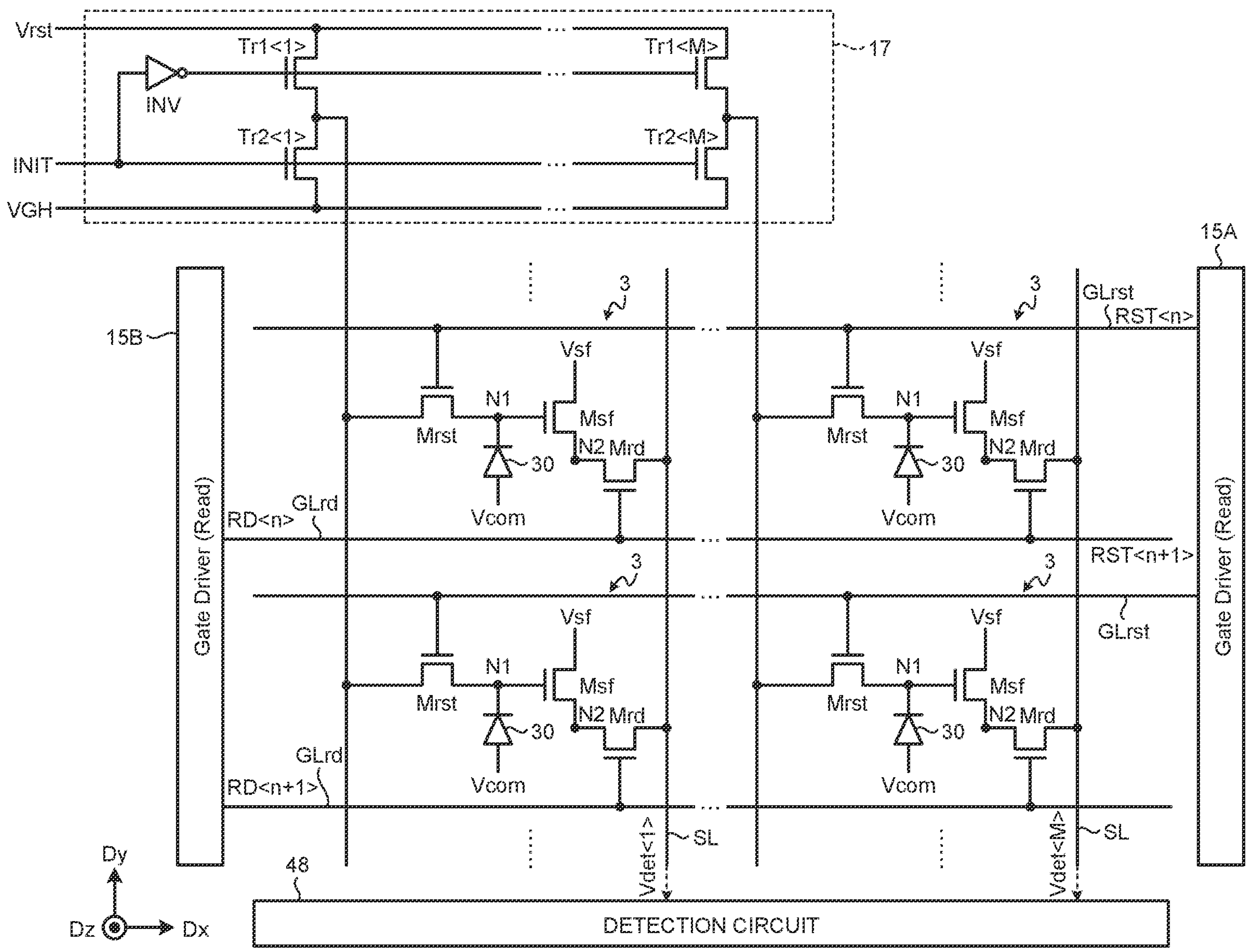
FIG. 11 is diagram illustrating a specific example of a configuration to which the initialization circuit of the detection device according to the first embodiment is applied.
Figure 12:
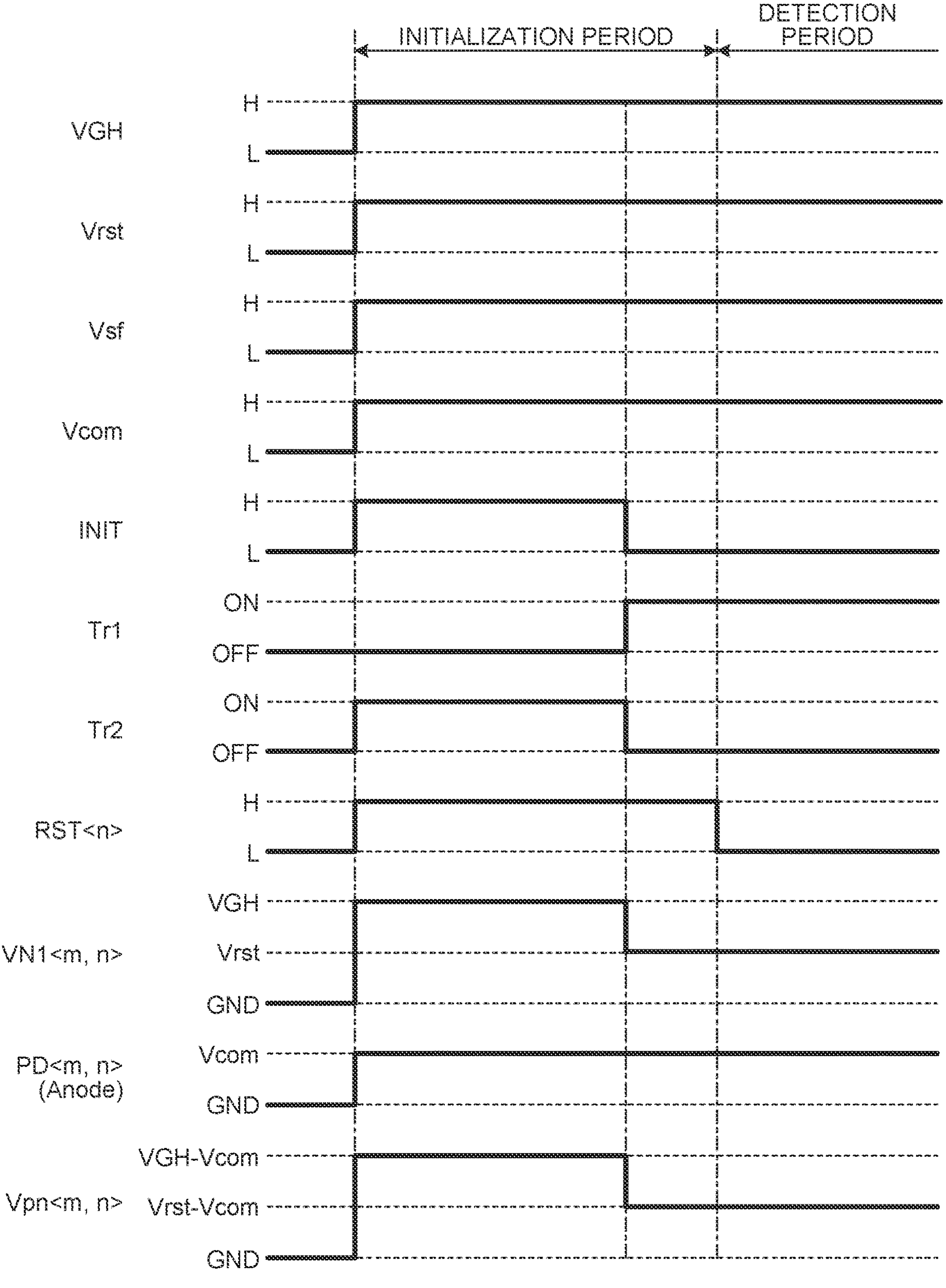
FIG. 12 is a timing diagram explaining an operation of the initialization circuit of the detection device according to the first embodiment.
Figure 13:
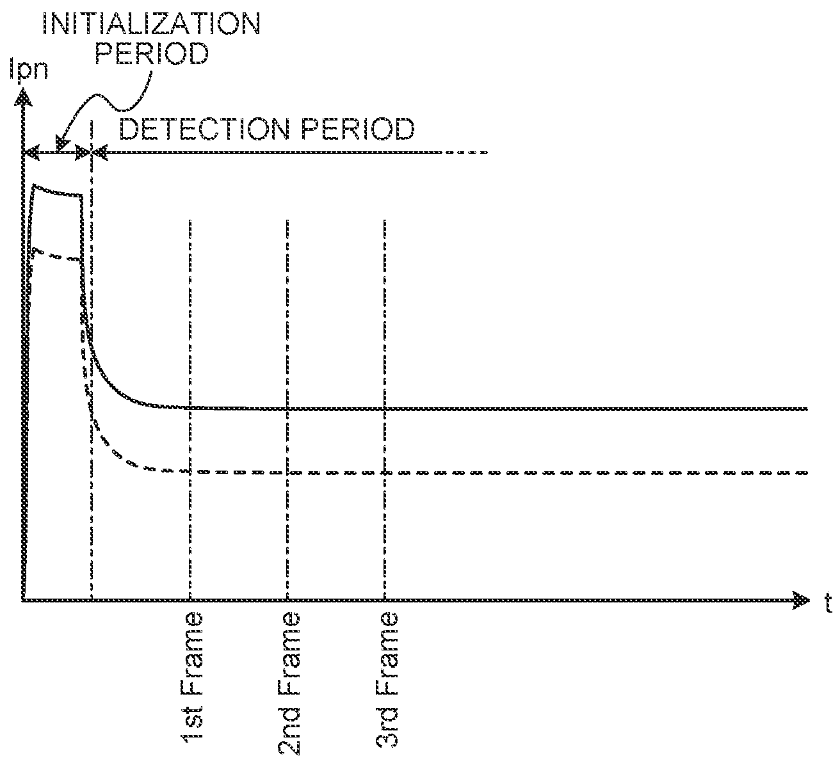
FIG. 13 is a diagram illustrating the relation between the reverse bias voltage and the reverse bias current of the PIN photodiode when the initialization circuit of the detection device according to the first embodiment is applied.

FIG. 10 is a diagram illustrating a configuration example of an initialization circuit of the detection device according to a first embodiment of the present disclosure. FIG. 11 is diagram illustrating a specific example of a configuration to which the initialization circuit of the detection device according to the first embodiment is applied. FIG. 12 is a timing diagram explaining an operation of the initialization circuit of the detection device according to the first embodiment. FIG. 13 is a diagram illustrating the relation between the reverse bias voltage and the reverse bias current of the PIN photodiode when the initialization circuit of the detection device according to the first embodiment is applied.

As illustrated in FIG. 10, an initialization circuit 17 includes a first transistor Tr1 that applies the reset potential Vrst (first potential) to the cathode (node N1) of the photoelectric conversion element 30 through a reset transistor Mrst<m, n>, a second transistor Tr2 that applies a high potential VGH (second potential) higher than the reset potential Vrst (first potential) to the cathode (node N1) of the photoelectric conversion element 30 through the reset transistor Mrst<m, n>, and a logic inversion circuit INV that inverts the control logic between the first transistor Tr1 and the second transistor Tr2. In other words, the initialization circuit 17 includes wiring (first wiring) that applies the reverse bias voltage to the photoelectric conversion element 30 by supplying the reset potential Vrst (first potential) to the cathode of the photoelectric conversion element 30, and also includes wiring (second wiring) that applies the initialization voltage serving as a higher reverse bias voltage to the photoelectric conversion element 30 by supplying the high potential VGH (second potential) higher than the reset potential Vrst (first potential) to the cathode of the photoelectric conversion element 30. The initialization circuit 17 further includes a switch circuit (first transistor Tr1, second transistor Tr2, and logic inversion circuit INV) that couples one of the wiring (first wiring) that supplies the reset potential Vrst (first potential) and the wiring (second wiring) that supplies the high potential VGH to the detection elements 3. The high potential VGH (second potential) may be, for example, the power supply potential Vsf.

The initialization circuit 17 may have a configuration that includes the first transistor Tr1 and the second transistor Tr2 for each column of the detection elements 3 arranged in the second direction Dy of the detection area AA as illustrated in FIG. 11, or may have a configuration that includes the first transistor Tr1 and the second transistor Tr2 for each unit of a plurality of columns of the detection elements 3 arranged in the second direction Dy of the detection area AA.

The initialization circuit 17 is provided in the peripheral area GA. Specifically, in the configuration illustrated in FIG. 11, the initialization circuit 17 is provided in an area extending in the first direction Dx in the peripheral area GA. In an aspect of the present disclosure, the initialization circuit 17 may be provided, for example, between the sensor unit 10 and the detection circuit 48.

As illustrated in FIGS. 10 and 11, the initialization circuit 17 receives an initialization signal INIT. The gate of the second transistor Tr2 receives the initialization signal INIT, and the gate of the first transistor Tr1 receives a signal obtained by logically inverting the initialization signal INIT by the logic inversion circuit INV. The initialization signal INIT is controlled to be "H" (high-level voltage), and then to be "L" (low-level voltage) in the initialization period. In an aspect of the present disclosure, the initialization signal INIT may be, for example, output from the detection control circuit 11 (refer to FIG. 4). Furthermore, for example, in the configuration including the signal line selection circuit 16, the selection signal ASW supplied in the detection period may be used as the initialization signal INIT. In this case, in an aspect of the present disclosure, the selection signal ASW only needs to be controlled to be "H" (high-level voltage), and then to be "L" (low-level voltage) in the initialization period.

As illustrated in FIG. 12, in the initialization period provided immediately before the detection period, the initialization signal INIT and the reset control signal RST<n> are controlled to be "H" (high-level voltage); a potential VN1<m, n> of the node N1 is set to the high potential VGH (second potential) applied through the second transistor Tr2; and the high potential VGH (second potential) higher than the reset potential Vrst (first potential) is applied to the cathode of the photoelectric conversion element 30. As a result, the photoelectric conversion element 30 is reverse-biased by the differential voltage (potential difference) between the high potential VGH (second potential) applied to the cathode (node N1) and the reference potential Vcom applied to the anode (Vpn<m, n>=VGH−Vcom).

Then, the initialization signal INIT is controlled to be "L" (low-level voltage), and the potential VN1<m, n> of the node N1 is set to the reset potential Vrst (first potential) applied through the first transistor Tr1. As a result, the photoelectric conversion element 30 is reverse-biased by the differential voltage (potential difference) between the reset potential Vrst (first potential) applied to the cathode (node N1) and the reference potential Vcom applied to the anode (Vpn<m, n>=Vrst−Vcom).

While FIG. 12 illustrates an example in which the reference potential Vcom is a positive potential (Vcom>GND), the reference potential Vcom may be a ground (GND) potential or a negative potential (Vcom≤GND). The configuration of the initialization circuit 17 is not limited to the configurations illustrated in FIGS. 10 and 11, and only needs to be a configuration by which the reverse bias voltage Vpn (initialization voltage) higher than that applied in the detection period is applied to the photoelectric conversion element 30 in the initialization period. In an aspect of the present disclosure, the gate of the first transistor Tr1 may receive the initialization signal INIT, and the gate of the second transistor Tr2 may receive the signal obtained by logically inverting the initialization signal INIT by the logic inversion circuit INV. In this case, in an aspect of the present disclosure, the initialization signal INIT only needs be controlled to be "H" (high-level voltage) after being controlled to be "L" (low-level voltage) in the initialization period. Furthermore, the logic inversion circuit INV is not necessarily required. For example, in an aspect of the present disclosure, a signal XINIT obtained by logically inverting the initialization signal INIT may be received in addition to the initialization signal INIT.

As described above, in the first embodiment, the high potential VGH (second potential) higher than the reset potential Vrst (first potential) is applied to the cathode of the photoelectric conversion element 30 in the initialization period before the detection period. As a result, the reverse bias voltage Vpn (initialization voltage) higher than that applied in the detection period is applied to the photoelectric conversion element 30 in the initialization period. As a result, as illustrated in FIG. 13, the time for stabilizing the reverse bias current Ipn in the detection period is shortened, and the detection accuracy is restrained from decreasing when the detection signal Vdet is acquired over a plurality of frames (plurality of times).

Second Embodiment

Figure 14:
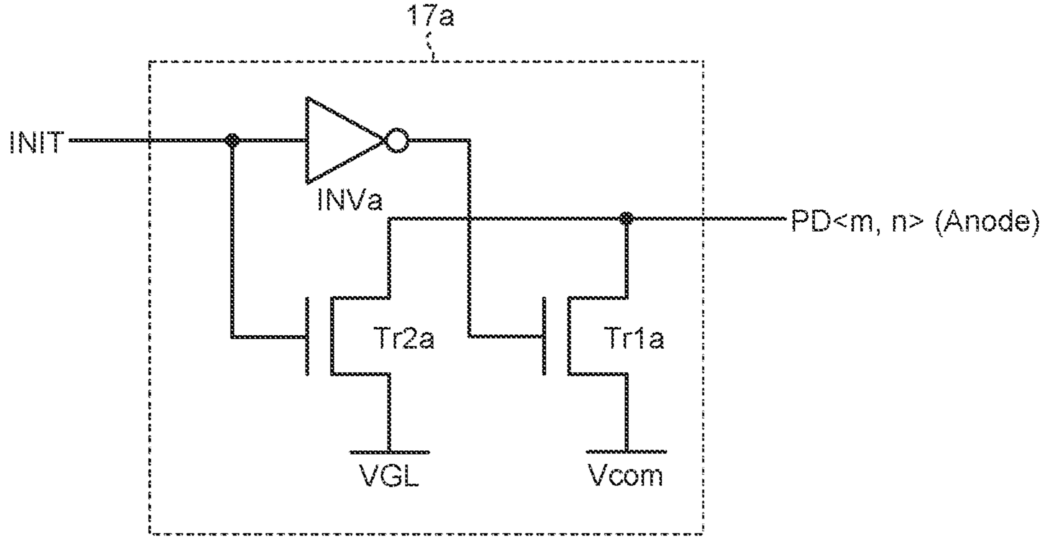
FIG. 14 is a diagram illustrating a configuration example of an initialization circuit of the detection device according to a second embodiment of the present disclosure.
Figure 15:
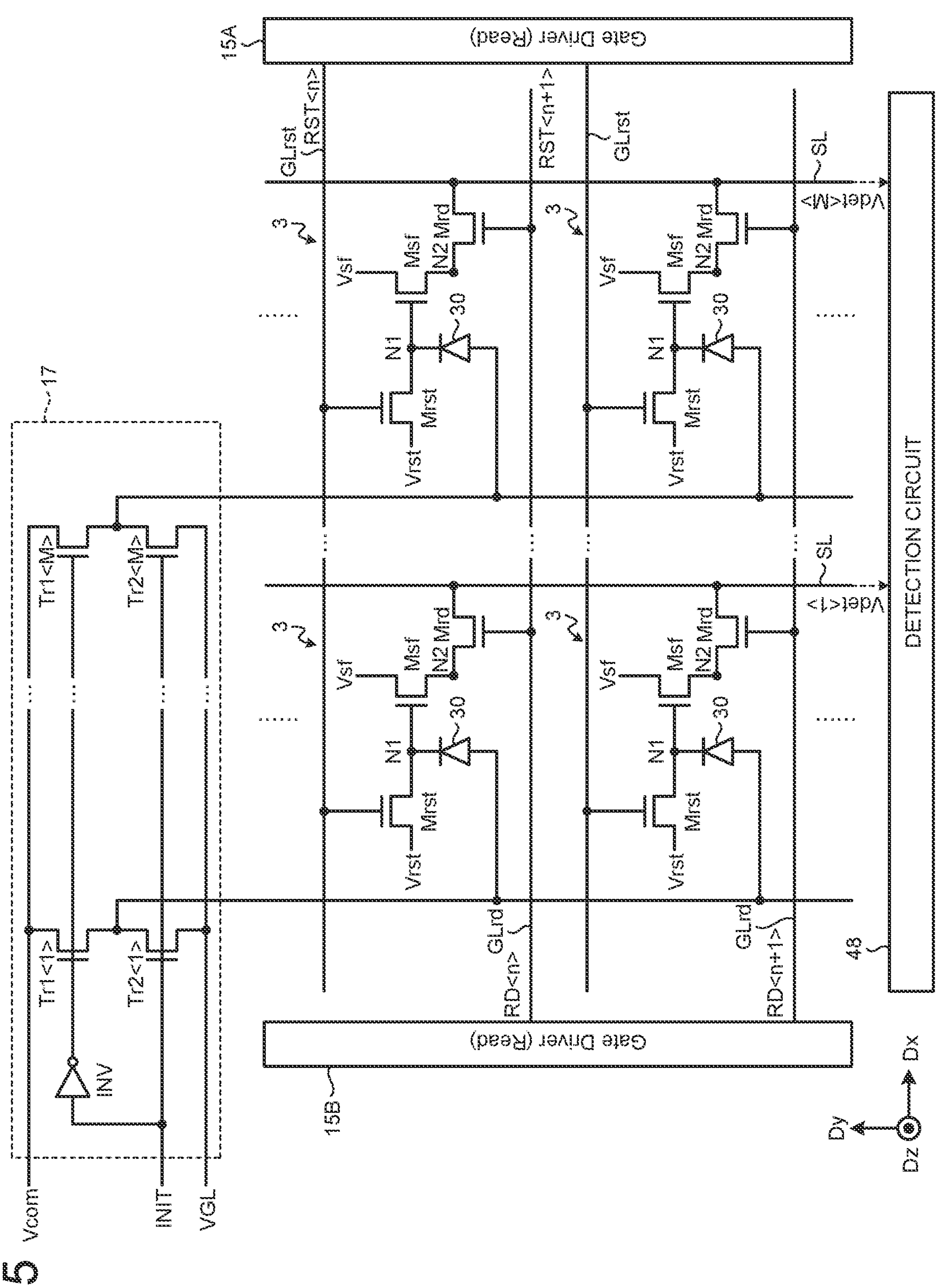
FIG. 15 is diagram illustrating a specific example of a configuration to which the initialization circuit of the detection device according to the second embodiment is applied.
Figure 16:
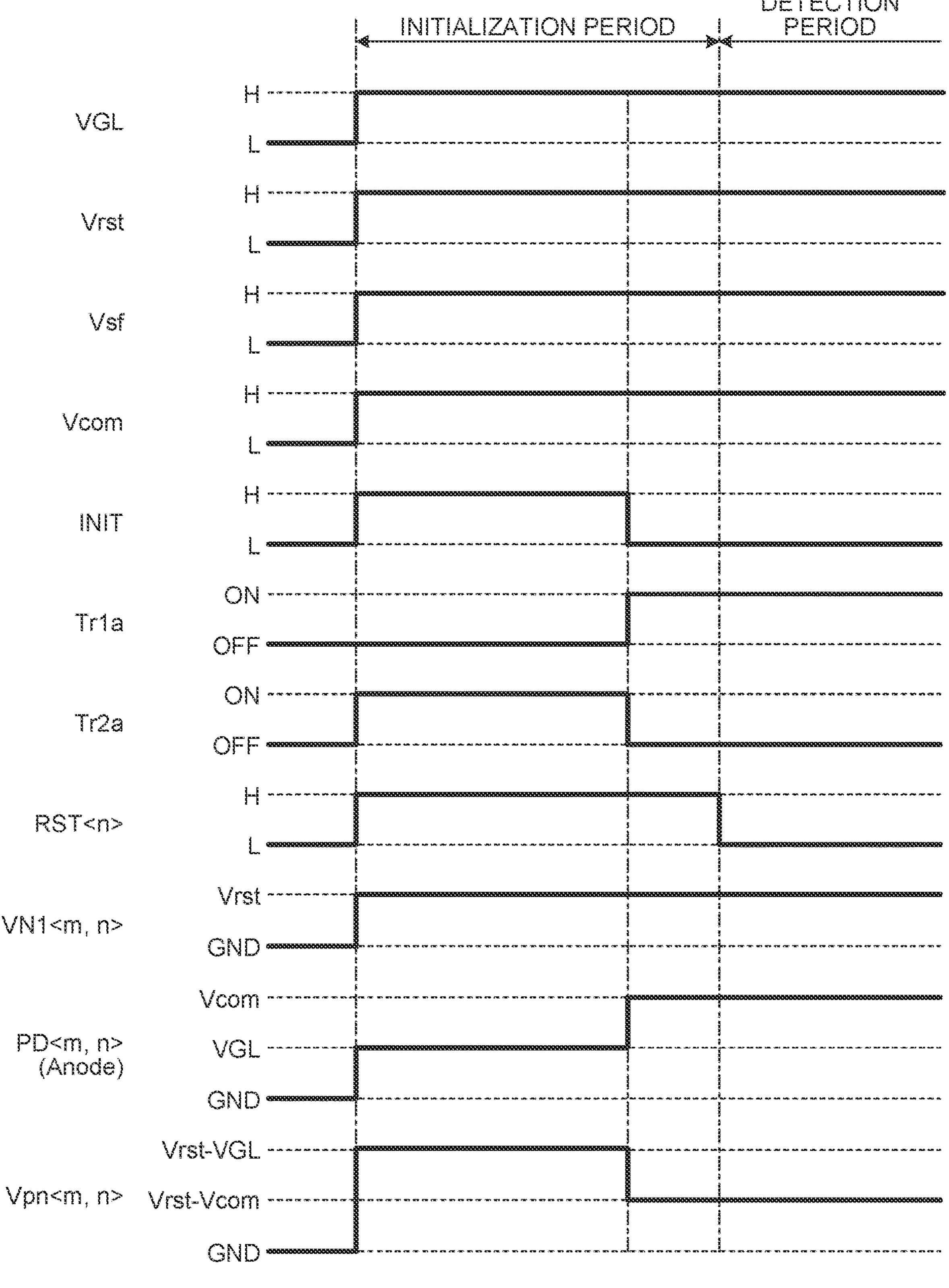
FIG. 16 is a timing diagram explaining an operation of the initialization circuit of the detection device according to the second embodiment.

FIG. 14 is a diagram illustrating a configuration example of an initialization circuit of the detection device according to a second embodiment of the present disclosure. FIG. 15 is diagram illustrating a specific example of a configuration to which the initialization circuit of the detection device according to the second embodiment is applied. FIG. 16 is a timing diagram explaining an operation of the initialization circuit of the detection device according to the second embodiment.

As illustrated in FIG. 14, an initialization circuit 17*a* according to the second embodiment includes a first transistor Tr1*a* that applies the reference potential Vcom (first potential) to an anode PD<m, n> (anode) of the photoelectric conversion element 30, a second transistor Tr2*a* that applies a low potential VGL (second potential) lower than the reference potential Vcom (first potential) to the anode PD<m, n> (anode) of the photoelectric conversion element 30, and a logic inversion circuit INVa that inverts the control logic between the first transistor Tr1*a* and the second transistor Tr2*a*. In other words, the initialization circuit 17*a* includes wiring (first wiring) that applies the reverse bias voltage to the photoelectric conversion element 30 by supplying the reference potential Vcom (first potential) to the anode of the photoelectric conversion element 30, and also includes wiring (second wiring) that applies the initialization voltage serving as a higher reverse bias voltage to the photoelectric conversion element 30 by supplying the low potential VGL (second potential) lower than the reference potential Vcom (first potential) to the anode of the photoelectric conversion element 30. The initialization circuit 17*a* further includes a switch circuit (first transistor Tr1, second transistor Tr2, and logic inversion circuit INV) that couples one of the wiring (first wiring) that supplies the reference potential Vcom (first potential) and the wiring (second wiring) that supplies the low potential VGL (second potential) to the detection elements 3. The low potential VGL (second potential) may be, for example, the GND potential.

The initialization circuit 17*a* may have a configuration that includes the first transistor Tr1*a* and the second transistor Tr2*a* for each column of the detection elements 3 arranged in the second direction Dy of the detection area AA as illustrated in FIG. 15, or may have a configuration that includes the first transistor Tr1*a* and the second transistor Tr2*a* for each unit of a plurality of columns of the detection elements 3 arranged in the second direction Dy of the detection area AA.

The initialization circuit 17*a* is provided in the peripheral area GA. Specifically, in the configuration illustrated in FIG. 15, the initialization circuit 17*a* is provided in an area extending in the first direction Dx in the peripheral area GA. In an aspect of the present disclosure, the initialization circuit 17*a* may be provided, for example, between the sensor unit 10 and the detection circuit 48.

As illustrated in FIGS. 14 and 15, the initialization circuit 17*a* receives the initialization signal INIT. The gate of the second transistor Tr2*a* receives the initialization signal INIT, and the gate of the first transistor Tr1*a* receives a signal obtained by logically inverting the initialization signal INIT by the logic inversion circuit INV. The initialization signal INIT is controlled to be "H" (high-level voltage) in the initialization period, and controlled to be "L" (low-level voltage) in the detection period. In an aspect of the present disclosure, the initialization signal INIT may be, for example, output from the detection control circuit 11 (refer to FIG. 4). Furthermore, for example, in the configuration including the signal line selection circuit 16, the selection signal ASW supplied in the detection period may be used as the initialization signal INIT. In this case, in an aspect of the present disclosure, the selection signal ASW only needs to be controlled to be "H" (high-level voltage), and then to be "L" (low-level voltage) in the initialization period.

As illustrated in FIG. 16, in the initialization period provided immediately before the detection period, the initialization signal INIT and the reset control signal RST<n> are controlled to be "H" (high-level voltage), and the low potential VGL (second potential) lower than the reference potential Vcom (first potential) is applied to the anode of the photoelectric conversion element 30 through the second transistor Tr2*a*. As a result, the photoelectric conversion element 30 is reverse-biased by the differential voltage (potential difference) between the reset potential Vrst applied to the cathode (node N1) and the low potential VGL (second potential) applied to the anode (Vpn<m, n>=Vrst−VGL).

Then, the initialization signal INIT is controlled to be "L" (low-level voltage), and the potential of the anode of the photoelectric conversion element 30 is set to the reference potential Vcom (first potential) applied through the first transistor Tr1*a*. As a result, the photoelectric conversion element 30 is reverse-biased by the differential voltage (potential difference) between the reset potential Vrst applied to the cathode (node N1) and the reference potential Vcom (first potential) applied to the anode (Vpn<m, n>=Vrst−Vcom).

While FIG. 16 illustrates an example in which the reference potential Vcom is a positive potential (Vcom>GND) and the low potential VGL (second potential) is a positive potential (Vcom>VGL>GND), the low potential VGL (second potential) may be a GND potential or a negative potential (VGL≤GND). The reference potential Vcom may be a GND potential or a negative potential (Vcom≤GND). In this case, the low potential VGL (second potential) only needs to be a negative potential lower than the reference potential Vcom (VGL<Vcom GND). The configuration of the initialization circuit 17*a* is not limited to the configurations illustrated in FIGS. 14 and 15, and only needs to be a configuration by which the reverse bias voltage Vpn (initialization voltage) higher than that applied in the detection period is applied to the photoelectric conversion element 30 in the initialization period. In an aspect of the present disclosure, the gate of the first transistor Tr1 may receive the initialization signal INIT, and the gate of the second transistor Tr2 may receive the signal obtained by logically inverting the initialization signal INIT by the logic inversion circuit INV. In this case, in an aspect of the present disclosure, the initialization signal INIT only needs be controlled to be "H" (high-level voltage) after being controlled to be "L" (low-level voltage) in the initialization period. Furthermore, the logic inversion circuit INVa is not necessarily required. For example, in an aspect of the present disclosure, the signal XINIT obtained by logically inverting the initialization signal INIT may be received in addition to the initialization signal INIT.

As described above, in the second embodiment, the low potential VGL (second potential) lower than the reference potential Vcom (first potential) is applied to the anode of the photoelectric conversion element 30 in the initialization period before the detection period. As a result, the reverse bias voltage Vpn (initialization voltage) higher than that applied in the detection period is applied to the photoelectric conversion element 30 in the initialization period. As a result, as illustrated in FIG. 13, the time for stabilizing the reverse bias current Ipn in the detection period is shortened, and the detection accuracy is restrained from decreasing when the detection signal Vdet is acquired over a plurality of frames (plurality of times), in the same manner as in the first embodiment.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A detection device comprising:

a plurality of detection elements that are arranged in a matrix having a row-column configuration in a detection area, each of the plurality of detection elements comprising a photoelectric conversion element to which a reverse bias voltage is configured to be applied to detect light irradiating the detection area; and an initialization circuit configured to apply an initialization voltage higher than the reverse bias voltage to a respective photoelectric conversion element before the reverse bias voltage is applied to the respective photoelectric conversion element.

2. The detection device according to claim 1, wherein the initialization circuit comprises:

a first transistor configured to apply a first potential to a cathode of the photoelectric conversion element; and a second transistor configured to apply a second potential higher than the first potential to the cathode of the photoelectric conversion element.

3. The detection device according to claim 1, wherein the initialization circuit comprises:

a first transistor configured to apply a first potential to an anode of the photoelectric conversion element; and a second transistor configured to apply a second potential lower than the first potential to the anode of the photoelectric conversion element.

4. The detection device according to claim 1, wherein each of the plurality of detection elements comprises:

a reset transistor configured to apply a reset potential to a cathode of the photoelectric conversion element;

a source follower transistor configured to output a signal corresponding to a potential generated by the photoelectric conversion element; and a read transistor configured to read an output signal of the source follower transistor.

5. A detection device comprising:

a plurality of detection elements that are arranged in a matrix having a row-column configuration in a detection area, each of the plurality of detection elements comprising a photoelectric conversion element to which a reverse bias voltage is configured to be applied to detect light irradiating the detection area; and an initialization circuit configured to initialize the plurality of detection elements, wherein the initialization circuit comprises:

first wiring configured to supply the reverse bias voltage to a respective photoelectric conversion element;

second wiring configured to supply an initialization voltage higher the reverse bias voltage to the respective photoelectric conversion element; and a switch circuit configured to couple one of the first wiring and the second wiring to the plurality of detection elements.

* * * * *